United States Patent [19]
Band et al.

[11] 3,936,757
[45] Feb. 3, 1976

[54] AUTOMATIC GATE CONTROL SYSTEM

[75] Inventors: Ian T. Band, Los Altos; Kenneth J. MacLeod, San Jose, both of Calif.

[73] Assignee: Hewlett-Packard Company, Palo Alto, Calif.

[22] Filed: Oct. 17, 1974

[21] Appl. No.: 515,730

[52] U.S. Cl............... 328/72; 307/225 R; 307/269; 328/39; 328/63; 328/129
[51] Int. Cl.[2]..................... H03K 17/00; H03K 3/66
[58] Field of Search........... 307/269, 225 R; 328/63, 328/72, 39, 129, 130; 324/78 D

[56] References Cited
UNITED STATES PATENTS

| | | | |
|---|---|---|---|
| 3,304,504 | 2/1967 | Horlander | 328/63 X |
| 3,710,262 | 1/1973 | Sorensen | 328/63 X |

Primary Examiner—John Zazworsky
Attorney, Agent, or Firm—Theodore S. Park

[57] ABSTRACT

An automatic gate control system for automatically controlling the gate of a multifunction counter for maximum resolution within a fixed maximum time limit includes a Gate Control Apparatus for Setting the Input Signal Counting Interval patented by Ian T. Band and disclosed in U.S. Pat. No. 3,693,097 issued Sept. 19, 1972, a timer responsive to a Q output of a D-type flip-flop and serially connected with an input of an OR gate and a Q output of the D-type flip-flop. The OR gate applies a set signal to a second flip-flop having a $\bar{Q}$ output coupled to a "D" input of the first flip-flop.

3 Claims, 2 Drawing Figures

| FUNCTION | PULSE SHAPER | MAIN GATE 519 |
|---|---|---|
| FREQUENCY | REFERENCE | $F_x$ |
| PERIOD AVERAGE | $F_x$ | REFERENCE |
| FREQUENCY RATIO | $F_y$ | $F_x$ |
| T.I. AVERAGE | EVENTS FROM INPUT SYNCHRONIZERS | GATED REFERENCE |

$F_x$, $F_y$ ARE SIGNALS TO BE MEASURED

FIGURE 2

AUTOMATIC GATE CONTROL SYSTEM

BACKGOUND AND SUMMARY OF THE INVENTION

This system is used with the gate control apparatus patented by Ian T. Band in U.S. Pat. No. 3,693,097 issued Sep. 19, 1972. U.S. Pat. No. 3,693,097 is fully incorporated by reference. Referring to FIG. 5 of the above-identified patent, the detect carry line is removed and is replaced by the output of a timer. The timer is started when a main gate opens. The timer enables the closing of the gate after a time which is invariant for all measurements. The gate control apparatus then closes the gate on its next output pulse. This is not true for the system disclosed in U.S. Pat. No. 3,693,097 because the input to the gate control apparatus therein disclosed is a signal of unknown frequency in the following functions: frequency ratio, period average and time interval average. Since the unknown frequency may be arbitrarily low, the carry output may not occur for an arbitrarily long time.

It is not necessarily suitable in the above functions to depend on the 9 output of the decade counting and display assembly (DCDA) to enable the gate closing as is done in the system disclosed in U.S. Pat. No. 3,693,097, since the time required for this to occur is dependent on the number of digits in the DCDA and on the average input frequency to it.

The previously patented system is not, in general, suitable for automatically controlling the above three functions, as it might lead to arbitrarily long gate times. This new system maintains well controlled gate times of a convenient length for an operator. Further, it allows manual adjustment of automatic gate times by adjusting the timer.

DESCRIPTION OF THE DRAWINGS

FIG. 2 is a table showing how the embodiment of FIG. 1 may be connected to measure frequency, period average, frequency ratio or time interval average.

DESCRIPTION OF THE PREFERRED EMBODIMENT

Figure 1:
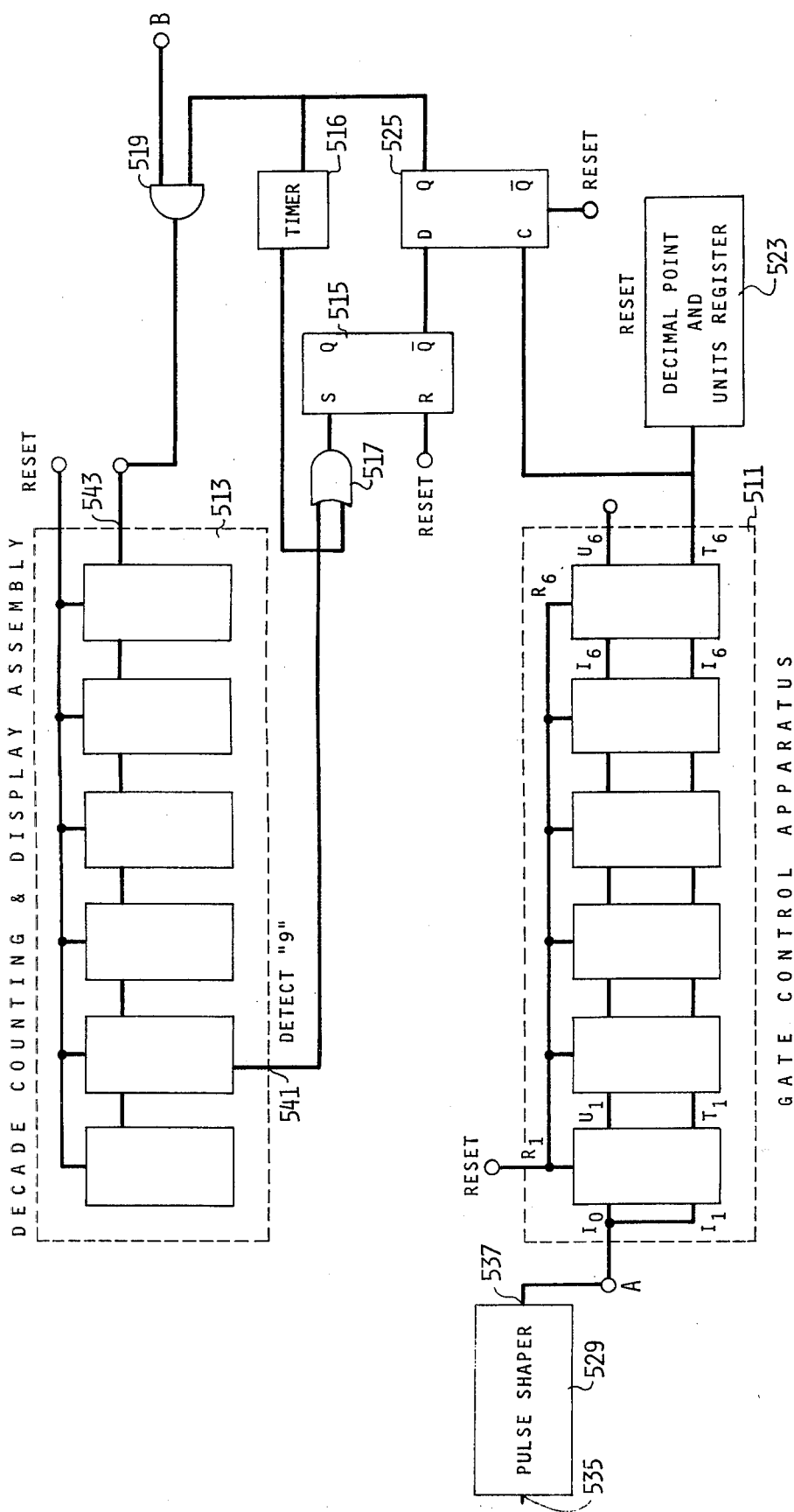
FIG. 1 shows a simplified block diagram of an improved automatic frequency, period average, ratio, or time interval measuring device according to the present invention.

This description incorporates by reference U.S. Pat. No. 3,693,097. Referring to FIG. 5 of the above incorporated and referenced patent, the detect carry line from gate control apparatus 511 to OR gate 517 is removed and replaced by a timer.

Referring to FIG. 1, a gate control apparatus 511 applies an output $T_6$ to a clock input of flip-flop 525. A timer 516 which may be a Signetics analog integrated circuit type NE 555 or the like or a more elaborate circuit, is serially coupled between an input of OR gate 517 and the Q output of flip-flop 525. The timer 516 starts in response to the opening of main AND gate 519 and the Q output of flip-flop 525. The timer 516 enables AND gate 519 to be closed by the next pulse from the gate control apparatus 511 by means of OR gate 517 setting flip-flop 515 whose $\overline{Q}$ output is coupled to a "D" input of the flip-flop 525. These pulses occur after 10, 100, 1000, etc. input pulses in the gate control apparatus 511 have occurred. The Q output of flip-flop 525 is coupled to an input of gate 519. Thus, if the timer 516 is set for 0.1 seconds, the next output pulse will occur within 0.9 seconds after the timer 516 enables the closing of gate 519. Timer 516 thereby allows well controlled gate times of a convenient length for an operator and readily adjusted gate times.

The automatic gate control system can be used to measure frequency, period average, ratio, and time interval average, with additional hardware such as input synchronizers to provide events and a gated reference. It is simply a matter of inserting the appropriate signal at each input as shown in FIG. 2. Decimal points and annunciators, however, must clearly be changed in any well known manner for each function.

We claim:
1. Selective timing means comprising:
   first gating means having a first input coupled to receive an applied train of pulses and a second input for producing the applied train of pulses at an output in response to a signal being applied at the second input;
   a gate control apparatus having a number of stages for producing a gate control signal at an output in response to $AB^0 + 1$, $AB^1 + 1$ ... $AB^{x-1} + 1$ and $nB^x + 1$ signal pulses applied at an input, where x is an integer representing the number of stages in the gate control apparatus, n is an integer 0 or greater, B is an integer greater than 1, and A is an integer greater than zero and less than or equal to $B - 1$;
   timing means responsive to a signal being applied at the second input of the first gating means for producing a timing signal; and
   logic means coupled to receive the timing signal and the gate control signal for applying a signal at the second input of the first gating means is response to said timing signal and said gate control signal.
2. Selective timing means as in claim 1 wherein first gating means comprise an AND gate having an output, a first input coupled to receive an applied train of pulses and a second input.
3. Selective timing means as in claim 2 wherein logic means comprise:
   a first flip-flop having a set input and a $\overline{Q}$ output;
   an OR gate connected to receive the timing signal and coupled to the set input of the first flip-flop; and
   a second flip-flop having a "D" input coupled to the $\overline{Q}$ output of the first flip-flop, a Q output coupled to the second input of the AND gate and a clock input coupled to receive the gate control signal.

* * * * *